(12) United States Patent
Bingler

(10) Patent No.: US 6,668,911 B2
(45) Date of Patent: Dec. 30, 2003

(54) PUMP SYSTEM FOR USE IN A HEAT EXCHANGE APPLICATION

(75) Inventor: Douglas J. Bingler, Geneva, NY (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 22 days.

(21) Appl. No.: 10/140,609

(22) Filed: May 8, 2002

(65) Prior Publication Data

US 2003/0209343 A1 Nov. 13, 2003

(51) Int. Cl.[7] .................................................. F28F 7/00
(52) U.S. Cl. ................................ 165/80.4; 165/104.25; 165/104.33; 361/699; 257/714; 174/15.1; 62/259.2
(58) Field of Search ........................... 165/80.4, 104.25, 165/104.28, 104.33; 361/699, 698; 257/712, 714; 62/259.2; 174/15.1

(56) References Cited

U.S. PATENT DOCUMENTS

| | | | | |
|---|---|---|---|---|
| 5,316,077 A | * | 5/1994 | Reichard | 165/104.28 |
| 5,731,954 A | * | 3/1998 | Cheon | 361/699 |
| 6,019,165 A | * | 2/2000 | Batchelder | 165/80.3 |
| 6,021,844 A | * | 2/2000 | Batchelder | 165/80.3 |
| 6,029,742 A | * | 2/2000 | Burward-Hoy | 165/80.4 |
| 6,327,145 B1 | * | 12/2001 | Lian et al. | 361/697 |
| 6,408,937 B1 | * | 6/2002 | Roy | 165/104.33 |

* cited by examiner

Primary Examiner—Terrell McKinnon

(57) ABSTRACT

In general, the invention relates to a pump system for use in a heat exchange application having a pump chamber with a fluid inlet and a fluid outlet. A rotating device is contained within the pump chamber, for causing a fluid to move across a surface to be cooled. The surface forms an integral part of the pump chamber in such a manner that the fluid as it passes through the rotating device also passes across the surface, resulting in a heat transfer between the surface and the fluid. Another aspect of the invention includes having the surface to be cooled integrally connected with the pump chamber, so that the pump chamber is separable from the surface to be cooled without disturbing the fluid circuit of the heat exchange application. A means for driving the rotating device may also be configured to drive a means for cooling the fluid.

18 Claims, 9 Drawing Sheets

US 6,668,911 B2

PUMP SYSTEM FOR USE IN A HEAT EXCHANGE APPLICATION

FIELD OF THE INVENTION

The present invention relates to a pump system for use in heat exchange applications, and more specifically, for use in microprocessor heat dissipation or other applications requiring high heat transfer with minimal pump power requirements.

BACKGROUND OF THE INVENTION

Microprocessors and many other electronic devices are conventionally cooled with air or liquid acting as the heat exchange medium. Typically, these fluids are forced to move through the heat exchanger by fans or pumps that move the fluid across the surface to be cooled.

However, as the energy densities in these devices increase, and as they become smaller and yet increasingly functional, heat dissipation by the use of these conventional techniques becomes unacceptable. The increasingly smaller scale of these devices and their correspondingly higher heat transfer requirements pose design considerations that cannot be met by conventional heat dissipation techniques. These smaller devices frequently demand greater quantities of heat exchange fluid flowing at greater velocities, resulting in increased pump power requirements. However, the physical packaging sizes of the systems are desired to be increasingly compact, as well, posing limitations on pump power.

Thus, a need exists for a heat dissipation technique that provides for compactness in size and high heat transfer capabilities while requiring minimal pump power.

SUMMARY OF THE INVENTION

The present invention relates to a pump system for use in a heat exchange application, having a pump chamber with a fluid inlet and a fluid outlet. A rotating device is contained within the pump chamber, for causing a fluid to move across a surface to be cooled. The surface to be cooled forms an integral part of the pump chamber, so that the fluid as it passes through the rotating device also passes across the surface to be cooled, resulting in a heat transfer between the surface and the fluid.

More particularly, the rotating device may be an impeller. A means for driving the rotating device can also be configured to drive a means for cooling the fluid. The means for driving the rotating device can be a motor, with motor windings comprising the stator and the rotor configured to operate as the rotating device. Additionally, the fluid inlet may be connected with a passageway for the fluid in such a manner that, before the fluid flows into the pump chamber, the fluid passes through the passageway and across an additional surface to be cooled, resulting in a heat transfer between the additional surface and the fluid.

Another aspect of the invention includes having the surface to be cooled integrally connected with the pump chamber, so that the pump chamber is separable from the surface to be cooled without disturbing the fluid circuit of the heat exchange application.

BRIEF DESCRIPTION OF THE FIGURES

For a fuller understanding of the invention, reference is made to the following description taken in connection with the accompanying drawings, in which.

DETAILED DESCRIPTION OF THE INVENTION

Figure 1:
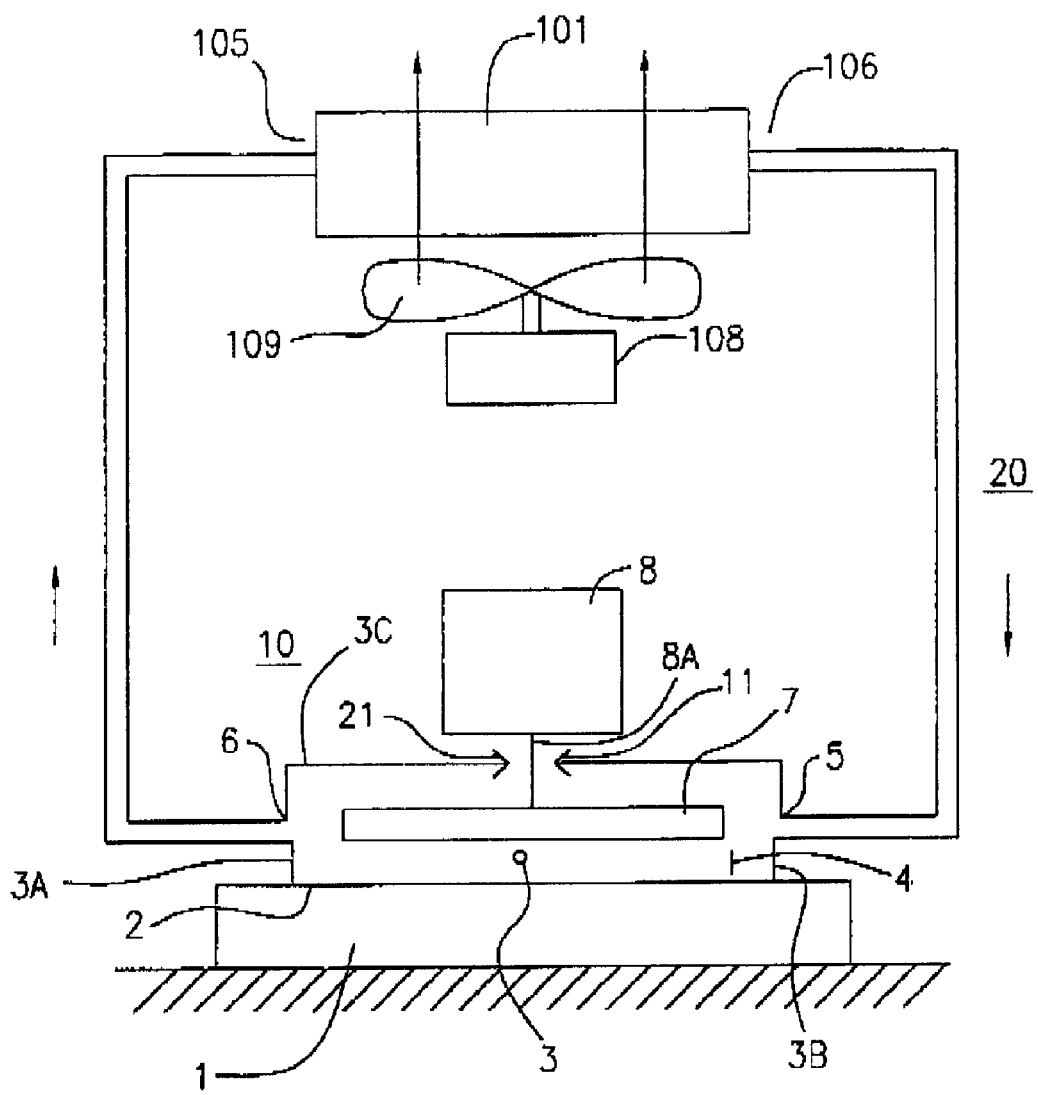
FIG. 1 is a sectional view of a heat exchange system showing the invention.

As shown in FIG. 1, the pump system 10 of the present invention comprises a part of a heat exchange system 20. A heat source 1 with a surface to be cooled 2 forms an integral part of a pump chamber 3. The pump chamber 3 has a fluid inlet 5 and a fluid outlet 6 and contains an impeller 7 for causing a fluid 4 to move through the pump chamber 3. The impeller 7 is driven by a motor 8.

The surface to be cooled 2 is connected with walls 3A and 3B of the pump chamber 3 by an attaching means known in the art, such as by the use of screws or bolts. As stated above, the surface 2 is configured to form an integral part of the pump chamber 3 and comprises a wall of the chamber 3, so that the fluid 4 as it moves in the chamber 3 contacts the surface 2. A suitable fluid sealant means, such as an O-ring or other type of gasket, may be used at the area of connection 3A and 3B with the chamber walls to prevent fluid leakage.

The heat exchange application as shown is a closed system and is totally sealed. A motor shaft 8A, which is movably positioned in an opening 11 in the pump chamber wall 3C connects the motor 8 to the impeller 7. A motor shaft seal 21 seals off the shaft opening 11, in order to prevent fluid leakage.

In operation, the fluid 4 is provided with momentum to move through the fluid circuit 20 by the rotating motion of the impeller 7. Heat is transferred from the surface to be cooled 2 to the fluid 4, which is then circulated to a fluid-to-air heat exchanger tube 101. The fluid 4 enters the heat exchanger tube 101 through an inlet 105 and exits through an outlet 106. The fluid 4 is cooled in the heat exchanger by air passing over the outside surface of the tube 101, in the direction indicted by the arrows. The air is pumped by a fan 109 driven by a fan motor 108.

In conventional pump systems, the surface to be cooled is typically located distantly from the pump chamber. By configuring the surface to be cooled 2 to be an integral part of the pump chamber 3, the fluid 4 as it passes through the impeller 7 also passes across the surface to be cooled 2. The close proximity of the impeller 7 to the surface 2 in this configuration provides for an increased velocity of the fluid flow as it passes across the surface 2, resulting in higher heat transfer. This increase in heat transfer is achieved without requiring greater pump power or an increase in heat transfer surface area. Additionally, the present invention allows for compactness of physical size, since the surface 2 is configured to be a part of the chamber 3.

Thus, the subject invention accomplishes greater heat transfer, while requiring minimal pump power. Such advantages are needed in the cooling of electronic devices such as next generation microprocessors or other applications. The system also allows for compactness in size, which has particular usefulness for the package size limitations posed by increasingly smaller electronic devices. A demand for significant weight savings, as exemplified in the design of many personal computers, may also be met. Cost savings such as lower pumping costs and heat exchanger piping costs may also be achieved.

Figure 2:
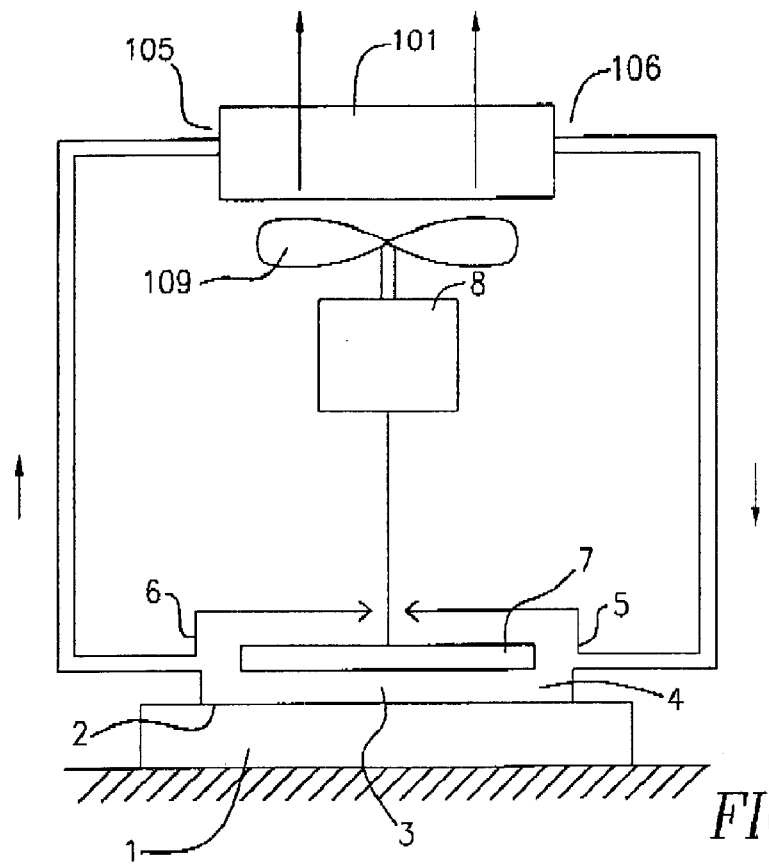
FIG. 2 is a sectional view of a heat exchange system showing the invention using a single motor for both the fan and pump.
Figure 2A:
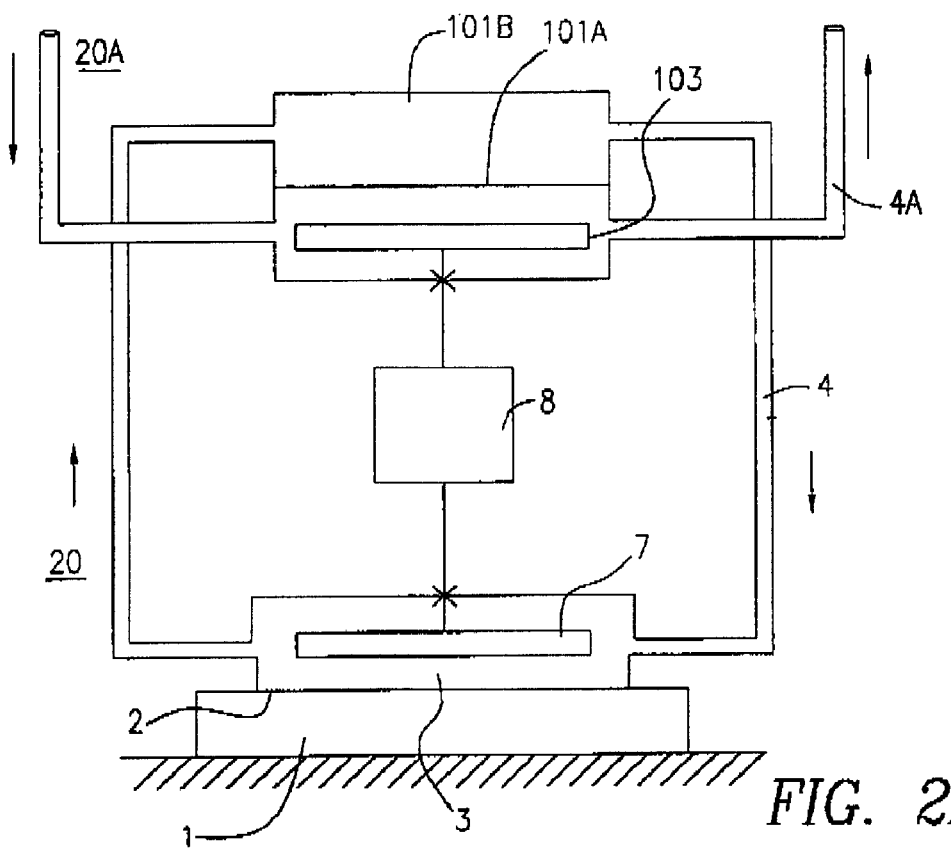
FIG. 2A is a sectional view of a heat exchange system showing the invention using a single motor for two separate fluid circuits.

FIG. 2 shows a mode of the invention incorporating a dual shaft configuration, where a single motor 8 is designed to drive both the impeller 7 and the fan 109. This design achieves a further decrease in system size and cost, by eliminating the need for two separate motors. FIG. 2A shows the same configuration as depicted in FIG. 2, where a liquid to liquid heat exchanger is used to cool the fluid. The single motor 8 drives both the impeller 7 and a second pumping device 103, used to move a second heat exchange fluid 4A through a separate fluid circuit 20A. The second fluid 4A removes heat from the first fluid 4 through a common heat transfer barrier 101A, as they flow in their respective circuits 20 and 20A.

Figure 3:
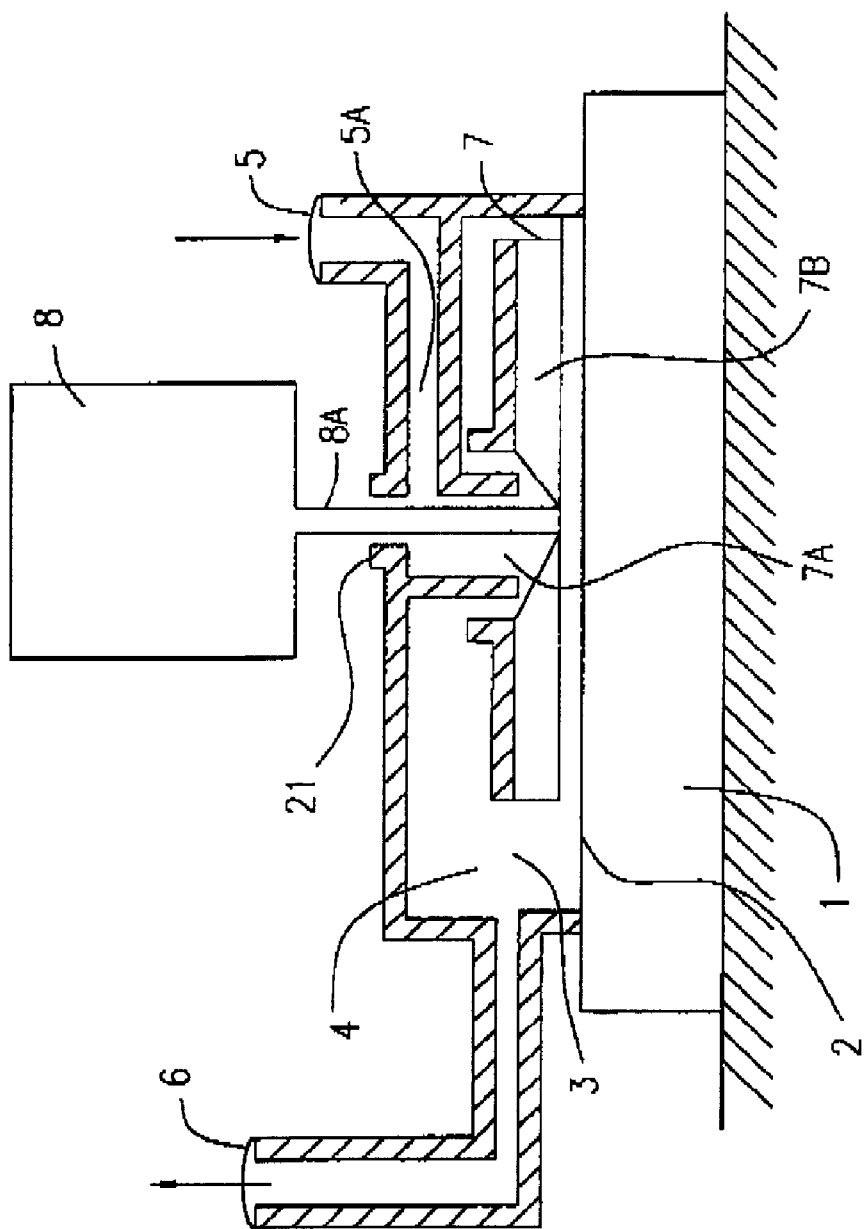
FIG. 3 is a sectional view of the invention showing the pump chamber inlet aligned with a center inlet of the impeller.

FIG. 3 depicts in detail the pump chamber 3 of one version of the subject invention. The inlet 5 to the chamber 3 is configured to comprise a passageway 5A for the fluid 4, such that the passageway 5A is aligned with an inlet 7A of the impeller 7. The fluid 4 flows axially into the center of the impeller 7. The motor 8 is coupled to a motor shaft 8A that is connected to the impeller 7, which has vanes 7B that are positioned to be in close proximity to the surface to be cooled 2.

Figure 4:
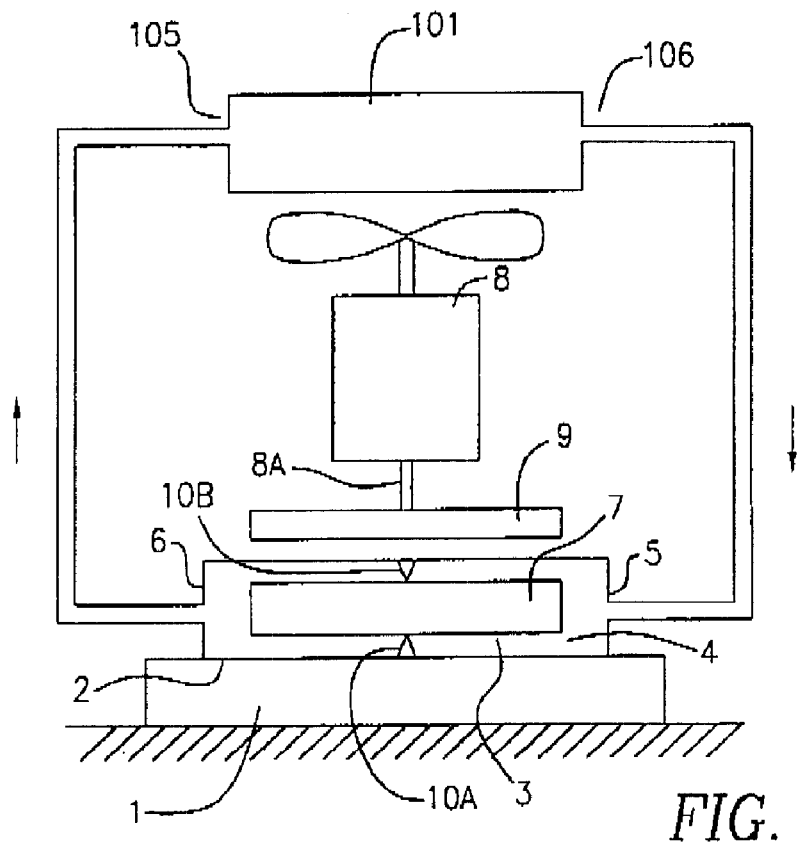
FIG. 4 shows the dual shaft configuration depicted in FIG. 2, where the motor has a magnetic disk that is magnetically coupled to the impeller.

FIGS. 4 through 9 show various possible modes of the motor and the dual shaft configuration described above, as well as possible design configurations of the inlet to the pump chamber. Referring to FIG. 4, a variation is achieved on the dual shaft configuration shown in FIG. 2, where the impeller 7 is now driven by magnetic means. The motor 8 has a magnetic disk 9 that is attached to the motor shaft 8A and is magnetically coupled to a magnetic disk which is also configured to be the impeller 7, thereby synchronizing the rotation of the motor shaft's magnetic disk 9 with the rotation of the impeller 7. The impeller 7 may be supported by liquid lubricated bearings 10A and 10B.

Figure 5:
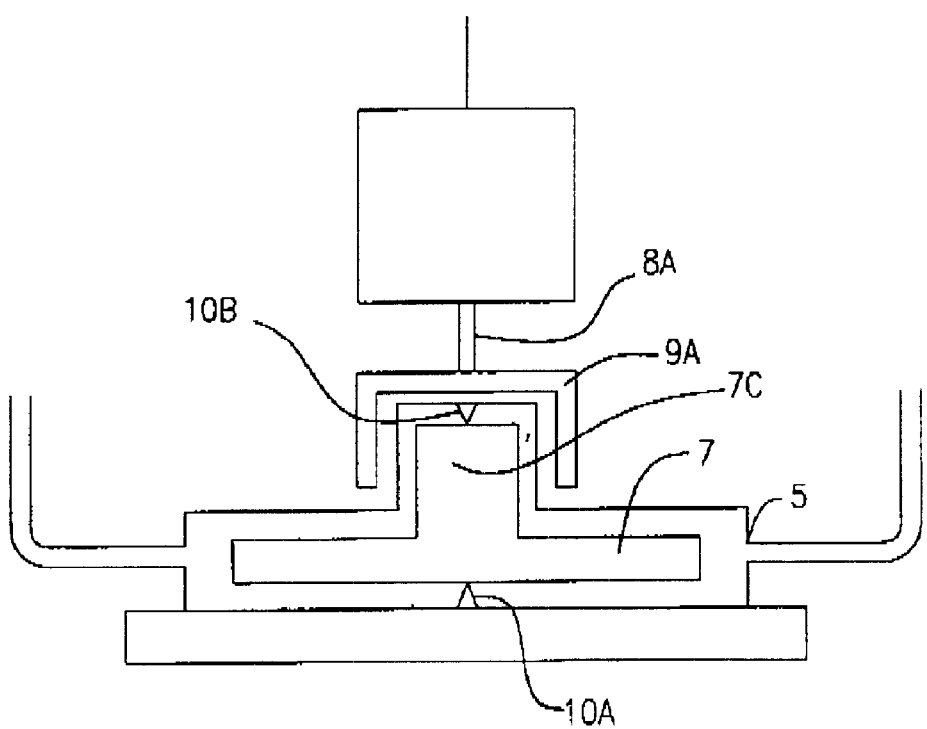
FIG. 5 shows the mode depicted in FIG. 4, using a ring-type magnet drive design.

In the aspect of the invention shown in FIG. 5, a further variation is achieved on the design depicted in FIG. 4, where the magnetic element that is attached to the motor shaft 8 now has a cylindrical shape. This cylinder 9A is again magnetically coupled to the impeller 7, which is configured as another magnetic element and has a center portion 7C that extends into the hollow of the cylinder 9A. The impeller 7 in this ring-type drive design tends to orient itself in a centered position relative to the magnetic cylinder 9A. This tendency reduces impeller bearing thrust as compared to the design illustrated in FIG. 4, where the impeller 7 experiences an attraction in a single direction to the magnetic disk 9.

Figure 6A:
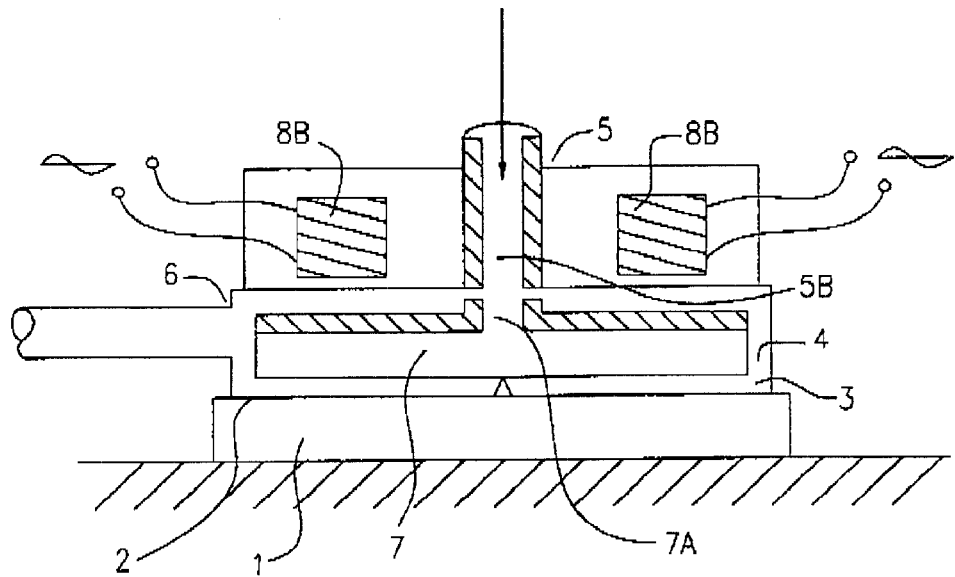
FIG. 6A shows the mode depicted in FIG. 6, configured with a center pump chamber inlet.
Figure 6B:
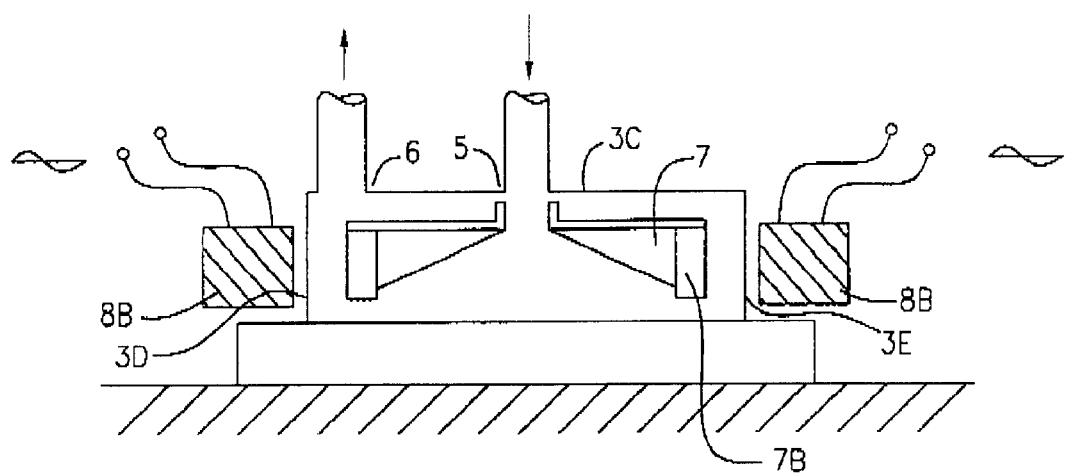
FIG. 6B shows the mode depicted in FIG. 6, with the motor windings positioned horizontally and adjacently to the pump chamber.
Figure 6C:
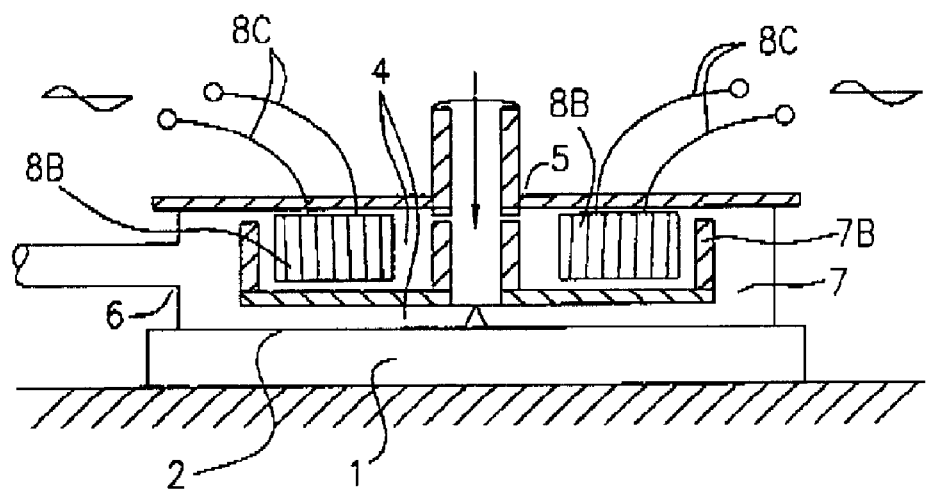
FIG. 6C shows the mode depicted in FIG. 6, with the motor windings positioned inside within the impeller blades and immersed in the heat exchange fluid.
Figure 6D:
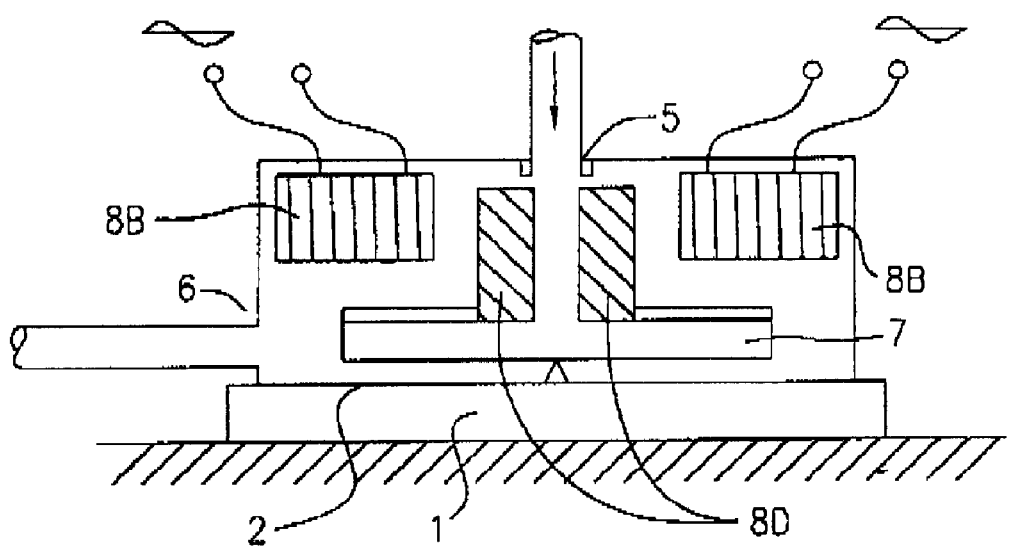
FIG. 6D shows the mode depicted in FIG. 6, with a rotor element attached centrally to the impeller.
Figure 6:
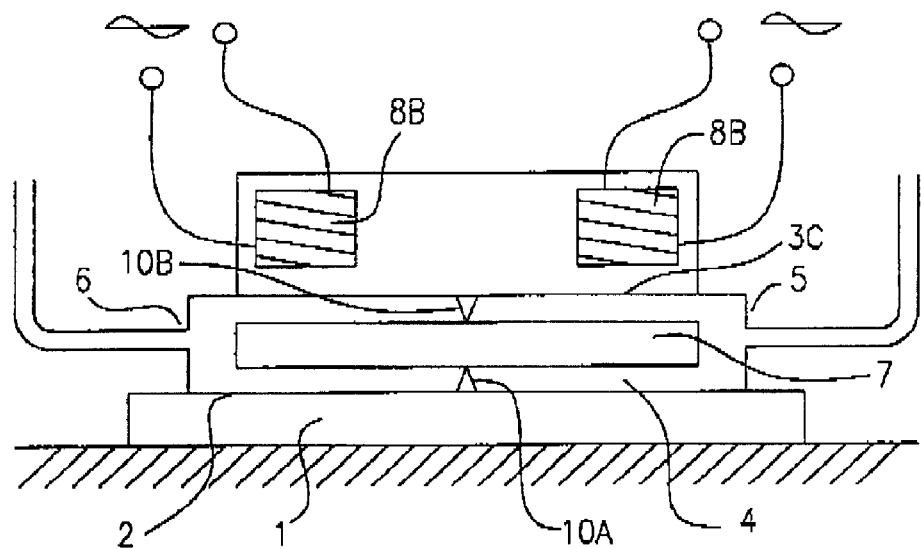
FIG. 6 is a sectional view of the invention, where the pump motor comprises motor windings as a stator and an impeller configured as a rotor.
Figure 7:
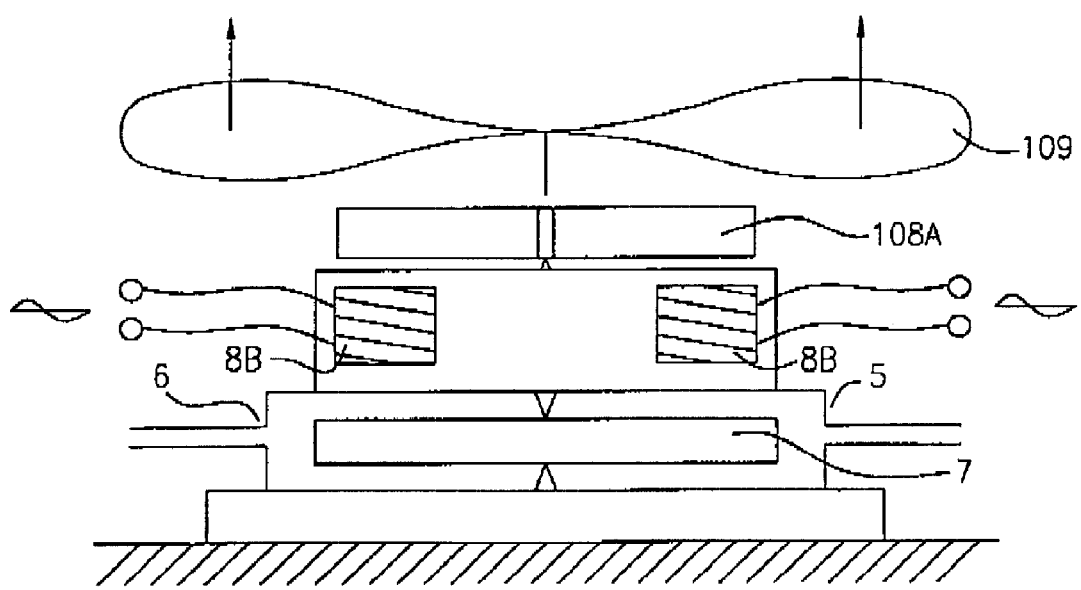
FIG. 7 is a sectional view of the invention, where the motor comprises motor windings as a stator which drives both the impeller and the fan.

Referring to the mode shown in FIG. 6, the motor now comprises a stator, which are motor windings 8B, and a rotor, now configured to be the impeller 7. The rotor may be configured to operate with various motor types commonly known or to be known in the art, such as inductive, permanent magnetic, switch reluctance, or a combination of such types. The stator rotates the impeller 7 by passing a magnetic field through the wall 3C of the chamber 3 and through the fluid 4.

FIG. 6A shows another possible version of the arrangement shown in FIG. 6, where the inlet 5 to the chamber 3 is configured to comprise a passageway 5B for the fluid 4, such that the fluid 4 passes between the motor windings 8B and flows into the chamber 3 in a direction axial to the rotation of the impeller 7. As described above, the inlet 5 is aligned with an inlet 7A of the impeller 7. This design may permit greater pump efficiencies, particularly if a centrifugal pump is used, since the fluid 4 flows into the pump chamber 3 in a direction axial to the rotation of the impeller 7. Additionally, due to the use of the motor windings as a stator, this configuration provides the advantage of a sealless design, as compared with the version illustrated in FIG. 3 requiring a motor shaft 8A and a motor shaft seal 21. Thus, this version may reduce the possibility of fluid leakage.

FIG. 6B shows a mode where the motor windings 8B now run horizontally and are located next to side walls 3D and 3E of the pump chamber 3. The fluid inlet 5 and fluid outlet 6 are located in wall 3C of the chamber 3, above the blades 7B of the impeller 7. This positioning of the stator results in a more compact design, thus allowing for cost, size and weight savings, as compared with the versions illustrated in FIGS. 6 and 6A.

In the variation shown in FIG. 6C, the motor windings 8B are positioned within the impeller blades 7B and are immersed in the heat exchange fluid 4. Essentially, the motor rotor surrounds the motor stator, providing higher rotational energy output relative to energy input due to their close proximity. Additionally, the fluid 4 helps to cool the motor windings 8B. Rather than requiring a separate housing for the motor windings 8B, this version requires only that the lead wires 8C be configured to extend outside of the pump chamber 3, thus allowing for a lower cost, lighter weight and more compact system.

FIG. 6D shows another possible variation on the mode depicted in FIG. 6C, which may maximize pump efficiencies for specific applications. A rotor element 8D comprising a magnet or constructed of iron or other suitable material depending on the motor type is attached centrally to the impeller 7. This rotor element, along with the appropriately tailored motor windings 8B, drives the impeller 7.

Referring to FIG. 7, the motor again consists of motor windings 8B, and this configuration now incorporates the dual shaft design similar to that described above for FIG. 2, where the motor stator drives both the impeller 7 and the fan 109. Essentially, both the impeller 7 and a fan motor element 108A are configured to be the motor rotors.

Figure 8:
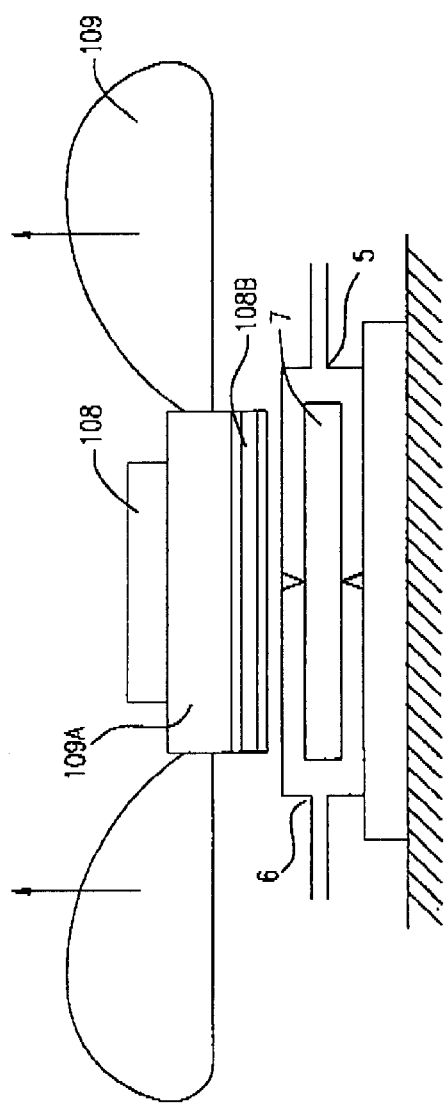
FIG. 8 is a sectional view of the invention, where the fan hub is magnetically coupled to the impeller.

Yet another possible variation is shown in FIG. 8, where the fan 109 has a hub 109A, which has a surface 108B that is magnetized and is magnetically coupled to the impeller 7. The fan motor 108 is positioned above the fan hub 109A, to drive both the fan 109 and the impeller 7.

Figure 9:
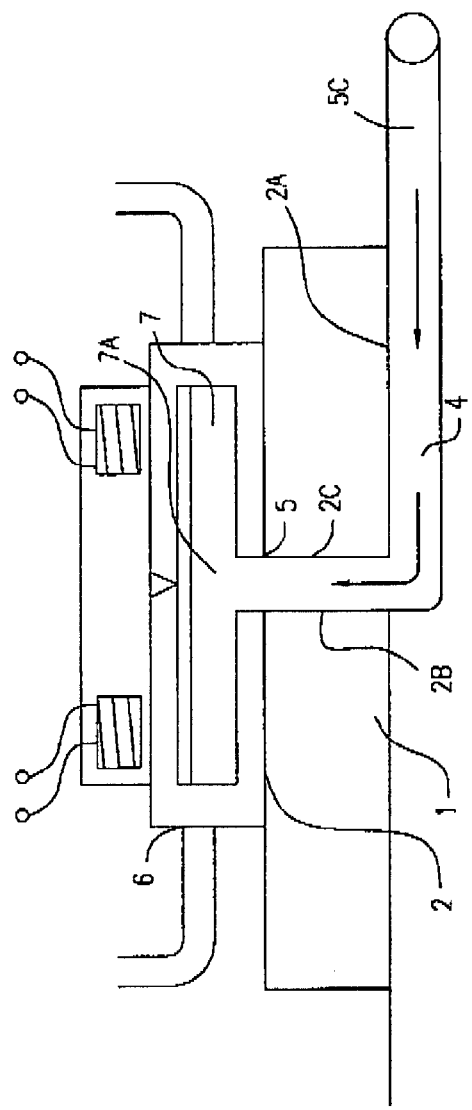
FIG. 9 shows the mode depicted in FIG. 6, configured with the pump chamber inlet connected to a passageway configured to provide additional heat transfer surface.

FIG. 9 illustrates another variation on the pump chamber inlet, where the inlet 5 to the chamber 3 is connected to a passageway or pipe 5C for the fluid 4, which is configured to extend adjacently to an additional surface to be cooled 2A of the heat source 1. The pipe 5C also passes through the heat source 1, resulting in further surfaces to be cooled 2B and 2C. This mode provides the advantage of increasing the heat transfer surface area, thereby increasing the cooling rate of the electronic device or other heat source 1. The modes of the pump chamber inlet 5 positions as shown in FIGS. 1, 3, 6A and 9 permit the maximization of pump efficiencies for various possible configurations.

Figure 10:
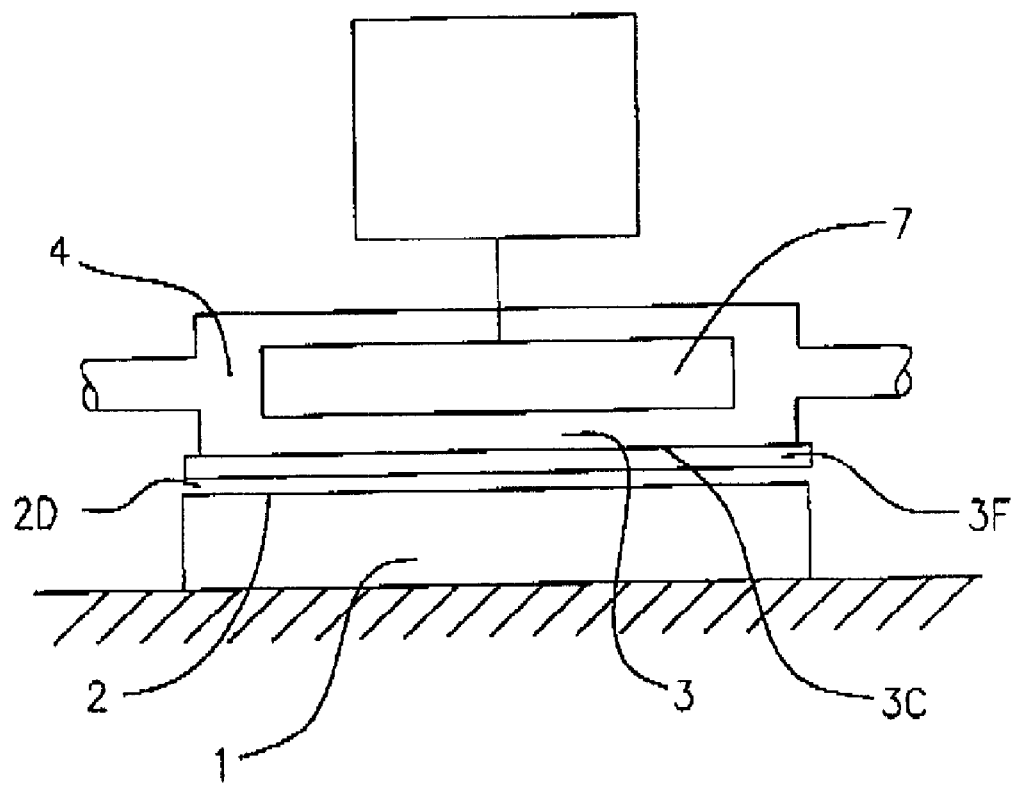
FIG. 10 is a sectional view of the invention, where the pump is separable from the surface to be cooled without disturbing the heat exchange fluid circuit.

FIG. 10 shows a mode where the surface to be cooled 2 is interfaced with a pump chamber component 3F, which is interfaced with a wall 3C of the pump chamber 3. The surface 2 no longer contacts the fluid 4. However, it remains integrally connected with the pump chamber 3, so that the fluid 4 as it passes through the impeller 7 still passes across the surface 2. A layer of thermally conductive material 2D may be incorporated between the pump chamber component 3F and the surface 2 to enhance heat transfer.

In this version, the pump chamber 3 can be separated from the surface 2 and reunited with the surface 2 without disturbing the fluid circuit and causing fluid leakage. This design provides for a more convenient assembly of the heat exchange circuit. As an example, an off-the-shelf heat exchanger or a standard heat exchanger produced by a subcontractor may be used, in place of a device particularly designed to join with the surface to be cooled 2.

It other possible variations, the surface to be cooled 2 may be configured to further enhance maximum heat transfer, such as by the incorporation of surface finishes, textures, passages, protrusions, angles or ribs designed to maximize heat transfer rates. Additionally, the pump system elements, such as the impeller, may be similarly designed with surface geometries that are optimized for heat transfer.

As a further advantage, the rotative speed of the impeller may be made dependent on various parameters such as flow rates, temperature or wattage of the heat source or flow pressures by means known in the art. The required adjustments to the impeller speed may be made by changing the rotational speed of the magnetic field in the stator. Such an arrangement permits the optimization of the impeller operation for maximum heat transfer.

The foregoing description of the embodiments of this invention has been presented for purposes of illustration and description. It is not intended to be exhaustive or to limit the embodiments of the invention to the form disclosed, and, obviously, many modifications and variations are possible. For example, various types of rotating devices as are known in the art, in addition to an impeller, may be used. Various rotodynamic pumps besides the design described above may be employed.

Other means of driving the impeller and the fan will also be apparent to those skilled in the art. As described above, the rotor may be configured for various motor types such as inductive, permanent magnet, switch reluctance or a combination of such types. The rotor may be coupled to the magnetic field of the stator by inductive means, in addition to magnetic means. Inductive means may also be used to couple a magnet connected to the motor with an impeller configured as a magnet.

Various other heat exchanger designs may also be utilized, such as air-to-air heat exchangers. The invention may also be used for an arrangement having a plurality of such heat exchange equipment, combined in series or in parallel. Such modifications and variations that may be apparent to a person skilled in the art are intended to be included within the scope of this invention as defined by the accompanying claims.

What is claimed is:

1. A pump system for use in a heat exchange application, comprising:
    a pump chamber having a fluid inlet and a fluid outlet;
    a heat source having a surface to be cooled, the surface to be cooled coupled to the pump chamber so that the surface to be cooled forms an integral part of the pump chamber; and
    a rotating device contained within the pump chamber for causing a fluid to move across the surface to be cooled, resulting in a heat transfer between the surface and the fluid.

2. The pump system of claim 1, where the rotating device is an impeller.

3. The pump system of claim 1, where the surface to be cooled comprises a wall of the pump chamber.

4. The pump system of claim 1, where a means for driving the rotating device also drives a means for cooling the fluid.

5. The pump system of claim 4, where the means for cooling the fluid is an additional heat exchange application having a separate fluid circuit.

6. The pump system of claim 1, where the fluid inlet is aligned with an inlet to the rotating device.

7. The pump system of claim 1, where the fluid inlet is connected with a passageway for the fluid which is configured so that, before the fluid flows into the pump chamber, the fluid passes through the passageway and across an additional surface to be cooled, resulting in an additional heat transfer between the additional surface and the fluid.

8. The pump system of claim 1, where a means for driving the rotating device has a motor shaft connected to a magnetic element, which is magnetically coupled with the rotating device that is configured as a second magnetic element.

9. The pump system of claim 1, where a means for driving the rotating device is a motor.

10. The pump system of claim 9, where the motor includes a stator having motor windings and a rotor which is configured to operate as the rotating device.

11. The pump system of claim 10, where the stator is contained within the pump chamber and immersed in the fluid, so that the fluid cools the stator.

12. The pump system of claim 10, where the rotor is configured to surround at least a part of the stator.

13. The pump system of claim 10, where a second rotor is configured to operate as a fan for cooling the fluid.

14. The pump system of claim 1, where the rotating device is magnetically coupled to a fan for cooling the fluid, which is coupled to a means for driving both the rotating device and the fan.

15. A pump system for use in a heat exchange application, comprising:
    a pump chamber, comprising a part of a heat exchange fluid circuit, having a fluid inlet and a fluid outlet;
    a heat source having a surface to be cooled, the surface to be cooled integrally connected with the pump chamber; and a rotating device, contained within the pump chamber, for causing a fluid to move across the surface to be cooled, resulting in a heat transfer between the surface and the fluid;

where the pump chamber is separable from the surface to be cooled without disturbing the heat exchange fluid circuit.

16. The pump system of claim 15, where the surface to be cooled is interfaced with a pump chamber component, which is interfaced with a wall of the pump chamber.

17. The pump system of claim 16, where a thermally conductive material is placed between the surface to be cooled and the pump chamber component, in order to enhance the heat transfer.

18. A method of cooling a heat source having a surface that requires high heat transfer and minimal pumping power comprising the steps of:

forming a pump chamber having a fluid inlet and a fluid outlet and a rotating device contained within the pump chamber for moving a fluid across the surface;

coupling the surface of the heat source to the pump chamber so that the surface forms an integral part of the pump chamber; and passing the fluid through the pump chamber, where the fluid as it passes through the rotating device also passes across the surface, resulting in a heat transfer between the surface and the fluid.

* * * * *